US010135238B2

(12) United States Patent
Ma et al.

(10) Patent No.: US 10,135,238 B2
(45) Date of Patent: Nov. 20, 2018

(54) MONITORING CIRCUIT AND ELECTRONIC DEVICE

(71) Applicant: Huawei Technologies Co., Ltd., Shenzhen (CN)

(72) Inventors: Donghai Ma, Shenzhen (CN); Zhiwei Leng, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 242 days.

(21) Appl. No.: 15/350,319

(22) Filed: Nov. 14, 2016

(65) Prior Publication Data

US 2017/0063078 A1  Mar. 2, 2017

Related U.S. Application Data

(63) Continuation of application No. PCT/CN2014/087950, filed on Sep. 30, 2014.

(30) Foreign Application Priority Data

May 14, 2014 (CN) .......................... 2014 1 0204159

(51) Int. Cl.
 *G05B 19/048* (2006.01)
 *H02H 9/04* (2006.01)
 (Continued)

(52) U.S. Cl.
 CPC ......... *H02H 9/044* (2013.01); *G01R 31/3278* (2013.01); *G05B 19/048* (2013.01); *H04L 43/00* (2013.01)

(58) Field of Classification Search
 USPC ........................................ 361/139, 144, 160
 See application file for complete search history.

(56) References Cited

U.S. PATENT DOCUMENTS 5,267,120 A  11/1993  Graff et al.
5,731,595 A  3/1998  Clark
(Continued)

FOREIGN PATENT DOCUMENTS

CN  201149721 Y  11/2008
CN  102084305 A  6/2011
(Continued)

OTHER PUBLICATIONS

Machine Translation and Abstract of Japanese Publication No. JP2005109813, Apr. 21, 2005, 5 pages.
(Continued)

*Primary Examiner* — Danny Nguyen
(74) *Attorney, Agent, or Firm* — Conley Rose, P.C.

(57) ABSTRACT

A monitoring circuit includes a configuration interface, a control circuit, a detection circuit, a direct current voltage source, a switch circuit, and a first resistor. A first end of the configuration interface is separately connected to the direct current voltage source and an input end of the switch circuit; a second end of the configuration interface is separately connected to a first end of the first resistor and an output end of the switch circuit; a control end of the switch circuit is connected to the control circuit; a second end of the first resistor is grounded; the detection circuit is connected to the first end of the first resistor; the configuration interface is configured to connect to a dry contact; the control circuit controls closing or opening of the switch circuit; and the detection circuit detects a voltage between two ends of the first resistor.

16 Claims, 2 Drawing Sheets

(51) Int. Cl.
*G01R 31/327* (2006.01)
*H04L 12/26* (2006.01)

(56) References Cited

U.S. PATENT DOCUMENTS

| | | | | |
|---|---|---|---|---|
| 9,419,429 | B2* | 8/2016 | Kim | H02H 5/042 |
| 2010/0271006 | A1* | 10/2010 | Fortner | G01R 19/1659 |
| | | | | 324/126 |
| 2013/0096853 | A1 | 4/2013 | Mahalingam et al. | |

FOREIGN PATENT DOCUMENTS

| | | |
|---|---|---|
| CN | 102193514 A | 9/2011 |
| CN | 103955161 A | 7/2014 |
| EP | 0958985 A2 | 11/1999 |
| EP | 2149826 A1 | 2/2010 |
| JP | H01295399 A | 11/1989 |
| JP | 2005109813 A | 4/2005 |
| JP | 2013089596 A | 5/2013 |
| WO | 2007025203 A2 | 3/2007 |
| WO | 2013153599 A1 | 10/2013 |

OTHER PUBLICATIONS

Machine Translation and Abstract of Japanese Publication No. JP01295399, Part 1, Nov. 29, 1989, 2 pages.
Machine Translation and Abstract of Japanese Publication No. JPH01295399, Part 2, Nov. 29, 1989, 3 pages.
Foreign Communication From A Counterpart Application, Japanese Application No. 2016-567853, Japanese Office Action dated Nov. 7, 2017, 3 pages.
Foreign Communication From A Counterpart Application, Japanese Application No. 2016-567853, English Translation of Japanese Office Action dated Nov. 7, 2017, 3 pages.
Machine Translation and Abstract of Chinese Publication No. CN103955161, Jul. 30, 2014, 2 pages.
Machine Translation and Abstract of European Publication No. EP0958985, Nov. 24, 1999, 7 pages.
"Pull-up and Pull-down Resistors," XP002768794, May 22, 2013, 6 pages.
Foreign Communication From A Counterpart Application, Chinese Application No. 201410204159.5, Chinese Office Action dated Feb. 3, 2016, 5 pages.
Foreign Communication From A Counterpart Application, European Application No. 14891994.7, Extended European Search Report dated Apr. 18, 2017, 10 pages.
Foreign Communication From A Counterpart Application, PCT Application No. PCT/CN2014/087950, English Translation of International Search Report dated Feb. 17, 2015, 2 pages.
Foreign Communication From A Counterpart Application, PCT Application No. PCT/CN2014/087950, English Translation of Written Opinion dated Feb. 17, 2015, 6 pages.

* cited by examiner

MONITORING CIRCUIT AND ELECTRONIC DEVICE

CROSS-REFERENCE TO RELATED APPLICATIONS

This application is a continuation of International Application No. PCT/CN2014/087950, filed on Sep. 30, 2014, which claims priority to Chinese Patent Application No. 201410204159.5, filed on May 14, 2014. The disclosures of the aforementioned applications are hereby incorporated by reference in their entireties.

TECHNICAL FIELD

The present application relates to the circuit field, and in particular, to a monitoring circuit and an electronic device.

BACKGROUND

A dry contact monitoring manner is generally used in a station power monitoring system. Dry contacts are classified into an input dry contact and an output dry contact. The input dry contact, for example, a switch or a button, is used to receive an external Boolean signal, and the output dry contact is used to implement alarm output, association control, or the like.

In an existing dry contact monitoring circuit, an input dry contact monitoring circuit and an output dry contact monitoring circuit are mutually independent. That is, the input dry contact monitoring circuit includes a configuration interface, a protection circuit, and a detection circuit, where the detection circuit is configured to detect a status of a signal received by an input dry contact connected to the configuration interface; the output dry contact monitoring circuit includes a configuration interface, a protection circuit, a relay, a control circuit, and a detection circuit, where the detection circuit is configured to detect a working status of the relay, and further determine a working status of an output dry contact connected to the configuration interface.

In the foregoing dry contact monitoring circuit, the input dry contact monitoring circuit and the output dry contact monitoring circuit use different configuration interfaces. When the output dry contact monitoring circuit configured in a system cannot satisfy a user requirement, the configuration interface in the input dry contact monitoring circuit cannot be configured as an output dry contact. When the input dry contact monitoring circuit configured in the system cannot satisfy a user's use requirement, the configuration interface in the output dry contact monitoring circuit cannot be configured as an input dry contact. Instead, an output dry contact monitoring circuit or an input dry contact monitoring circuit that satisfies a user requirement needs to be re-added, resulting in poor configurability of the system.

SUMMARY

Embodiments of the present application provide a monitoring circuit and an electronic device, which are used to improve configurability of a system.

To achieve the foregoing objective, the following technical solutions are adopted in the embodiments of the present application.

According to a first aspect, an embodiment of the present application provides a monitoring circuit, including a configuration interface, a control circuit, a detection circuit, a direct current voltage source, a switch circuit, and a first resistor, where a first end of the configuration interface is separately connected to the direct current voltage source and an input end of the switch circuit, a second end of the configuration interface is separately connected to a first end of the first resistor and an output end of the switch circuit, a control end of the switch circuit is connected to the control circuit, a second end of the first resistor is grounded, and the detection circuit is connected to the first end of the first resistor; the configuration interface is configured to connect to a dry contact, where the dry contact includes an input dry contact or an output dry contact; the control circuit is configured to control closing or opening of the switch circuit; and the detection circuit is configured to detect a voltage between two ends of the first resistor.

In a first possible implementation manner of the first aspect, that the control circuit is configured to control closing or opening of the switch circuit includes the control circuit is configured to control closing or opening of the switch circuit according to a preset rule when the configuration interface is connected to an output dry contact, where the detection circuit is further configured to determine a working status of the output dry contact according to the detected voltage between the two ends of the first resistor.

In a second possible implementation manner of the first aspect, that the control circuit is configured to control a closing or opening state of the switch circuit includes the control circuit is configured to control, when the configuration interface is connected to an input dry contact, the switch circuit to be opened, where the detection circuit is further configured to determine a working status of the input dry contact according to the detected voltage between the two ends of the first resistor.

With reference to the first aspect or the first or the second possible implementation manner of the first aspect, in a third possible implementation manner of the first aspect, the circuit further includes a protection circuit, where the protection circuit includes a discharge tube, a second resistor, a third resistor, a fourth resistor, and a fifth resistor; the first end of the configuration interface is connected to the input end of the switch circuit using the second resistor, a first end of the second resistor is connected to the first end of the configuration interface, a second end of the second resistor is connected to the input end of the switch circuit, the second end of the configuration interface is connected to the output end of the switch circuit using the third resistor, a first end of the third resistor is connected to the second end of the configuration interface, a second end of the third resistor is connected to the output end of the switch circuit, a first end of the discharge tube is connected to the first end of the second resistor, a second end of the discharge tube is connected to the first end of the third resistor, the first end of the configuration interface is connected to the direct current voltage source using the fourth resistor, a first end of the fourth resistor is connected to the direct current voltage source, a second end of the fourth resistor is connected to the first end of the second resistor, a first end of the fifth resistor is connected to the first end of the third resistor, and a second end of the fifth resistor is connected to the first end of the first resistor; and the protection circuit is configured to bleed off an overcurrent generated by an overvoltage received by the configuration interface.

With reference to the third possible implementation manner of the first aspect, in a fourth possible implementation manner of the first aspect, the discharge tube includes a gas discharge tube.

With reference to the first aspect or any one of the first to the fourth possible implementation manners of the first aspect, in a fifth possible implementation manner of the first aspect, the switch circuit includes a relay.

With reference to the first aspect or any one of the first to the fifth possible implementation manners of the first aspect, in a sixth possible implementation manner of the first aspect, the detection circuit includes an analog-to-digital conversion circuit and a microprocessing unit.

With reference to the first aspect or any one of the first to the sixth possible implementation manners of the first aspect, in a seventh possible implementation manner of the first aspect, the control circuit includes the switch circuit driving unit.

According to a second aspect, an embodiment of the present application provides an electronic device, including the monitoring circuit described in the foregoing embodiment.

The embodiments of the present application provide a monitoring circuit and an electronic device, where the monitoring circuit includes a configuration interface, a control circuit, a detection circuit, a direct current voltage source, a switch circuit, and a first resistor. The configuration interface is configured to connect to a dry contact, the control circuit is configured to control closing or opening of the switch circuit, and the detection circuit is configured to detect a voltage between two ends of the first resistor. That is, when the configuration interface is connected to an input dry contact, the control circuit controls the switch circuit to be opened, and the detection circuit determines an action status of the input dry contact according to a value of the detected voltage between the two ends of the first resistor; when the configuration interface is connected to an output dry contact, the control circuit controls closing or opening of the switch circuit according to a preset rule, and the detection circuit determines an action status of the output dry contact according to a value of the detected voltage between the two ends of the first resistor. In this way, an objective of detecting a dry contact is achieved. Therefore, when an output dry contact configured in a system cannot satisfy a user's use requirement, an input dry contact may be configured as an output dry contact; when an input dry contact configured in the system cannot satisfy a user's use requirement, an output dry contact may be configured as an input dry contact. Therefore, configurability of the system is improved.

BRIEF DESCRIPTION OF DRAWINGS

To describe the technical solutions in the embodiments of the present application more clearly, the following briefly introduces the accompanying drawings required for describing the embodiments. The accompanying drawings in the following description show merely some embodiments of the present application, and persons of ordinary skill in the art may still derive other drawings from these accompanying drawings without creative efforts.

DESCRIPTION OF EMBODIMENTS

The following clearly describes the technical solutions in the embodiments of the present application with reference to the accompanying drawings in the embodiments of the present application. The described embodiments are merely some but not all of the embodiments of the present application. All other embodiments obtained by persons of ordinary skill in the art based on the embodiments of the present application without creative efforts shall fall within the protection scope of the present application.

Figure 1:
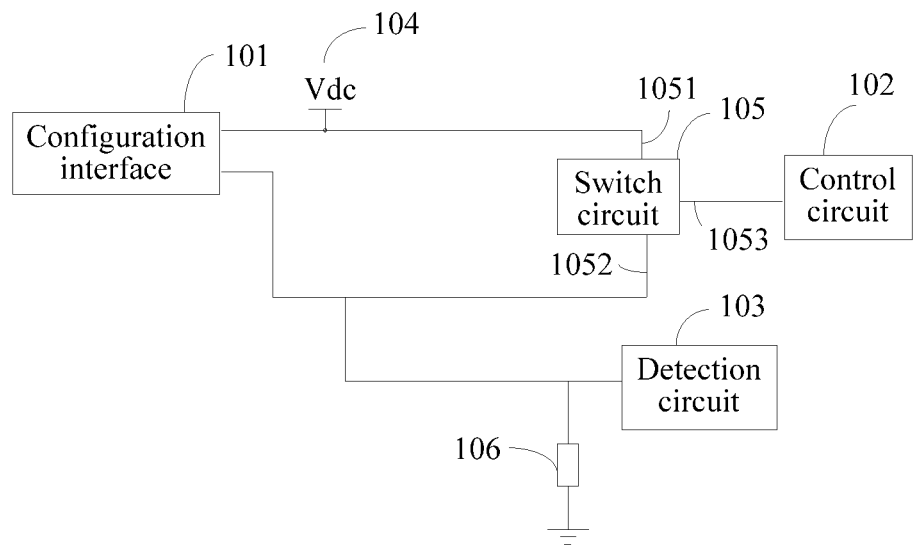
FIG. 1 is a schematic diagram of a monitoring circuit according to an embodiment of the present disclosure.

An embodiment of the present application provides a schematic diagram of a monitoring circuit. As shown in FIG. 1, the monitoring circuit includes a configuration interface 101, a control circuit 102, a detection circuit 103, a direct current voltage source 104, a switch circuit 105, and a first resistor 106.

The switch circuit 105 includes an input end 1051, an output end 1052, and a control end 1053.

A first end of the configuration interface 101 is separately connected to the direct current voltage source 104 and the input end 1051 of the switch circuit 105, a second end of the configuration interface 101 is separately connected to a first end of the first resistor 106 and the output end 1052 of the switch circuit 105, the control end 1053 of the switch circuit 105 is connected to the control circuit 102, a second end of the first resistor 106 is grounded, and the detection circuit 103 is connected to the first end of the first resistor 106.

The configuration interface 101 is configured to connect to a dry contact.

The dry contact includes an input dry contact or an output dry contact.

A user may configure the configuration interface 101 according to a requirement. When a system needs to detect an external Boolean signal, an input dry contact is connected to the configuration interface 101; when the system needs to implement alarm output or other output control, an output dry contact is connected to the configuration interface 101.

It should be noted that the input dry contact may be a button, a switch, or the like; the output dry contact may be an alarm or the like, which is not limited in the present application.

The control circuit 102 is configured to control closing or opening of the switch circuit 105.

The control circuit 102 includes the switch circuit driving unit.

It should be noted that, for a specific implementation method of the switch circuit driving unit, reference may be made to an implementation method in the prior art, and details are not described herein.

The detection circuit 103 is configured to detect a voltage between two ends of the first resistor 106.

The detection circuit 103 includes an analog-to-digital conversion circuit and a microprocessing unit.

When detecting the voltage between the two ends of the first resistor 106, the detection circuit 103 first converts a detected analog voltage between the two ends of the first resistor 106 into a digital voltage using the analog-to-digital conversion circuit, and inputs the digital voltage into the microprocessing unit, so that the microprocessing unit determines a working status of an input dry contact or an output dry contact according to a value of the digital voltage.

It should be noted that, for a specific implementation method of the analog-to-digital conversion circuit, reference may be made to an implementation method in the prior art, and details are not described herein.

It should be noted that the detection circuit 103 may further include a circuit of another functional module, for example, a filter circuit.

Further, the control circuit 102 is configured to control closing or opening of the switch circuit 105 according to a preset rule when the configuration interface 101 is connected to an output dry contact.

In this case, the detection circuit 103 is further configured to determine a working status of the output dry contact according to the detected voltage between the two ends of the first resistor 106.

That is, when the configuration interface 101 is connected to the output dry contact, the control circuit 102 determines, according to code configured by the user, that the configuration interface 101 is connected to an output dry contact, and therefore controls closing or opening of the switch circuit 105 according to the rule preset in the system. That is, when an action of the output dry contact is required, the control end 1053 of the switch circuit 105 is triggered to be closed, so that the input end 1051 and the output end 1052 that are of the switch circuit 105 are connected, so as to provide a loop to the action of the output dry contact, so that the output dry contact performs the action; when an action of the output dry contact is not required, the control end 1053 of the switch circuit 105 is controlled to be in an open state, and the input end 1051 and the output end 1052 that are of the switch circuit 105 are disconnected. Therefore, a loop cannot be formed and the output dry contact cannot perform the action.

When the configuration interface 101 is connected to the output dry contact, and the switch circuit 105 is conducted, the detection circuit 103 detects an analog voltage between the two ends of the first resistor 106, converts the detected analog voltage between the two ends of the first resistor 106 into a digital voltage using the analog-to-digital conversion circuit, and inputs the digital voltage into the microprocessing unit; the microprocessing unit determines that the digital voltage is greater than zero, and therefore determines that the output dry contact performs an action. When the switch circuit 105 is open, the detection circuit 103 detects a voltage between the two ends of the first resistor 106, converts a detected analog voltage between the two ends of the first resistor 106 into a digital voltage using the analog-to-digital conversion circuit, and inputs the digital voltage into the microprocessing unit; the microprocessing unit determines that the digital voltage is zero, and therefore determines that the output dry contact does not perform an action. In this way, an objective of detecting the output dry contact is achieved.

The control circuit 102 is configured to control, when the configuration interface 101 is connected to an input dry contact, the switch circuit 105 to be opened.

In this case, the detection circuit 103 is further configured to determine a working status of the input dry contact according to the detected voltage between the two ends of the first resistor 106.

That is, when the configuration interface 101 is connected to the input dry contact, the control circuit 102 determines, according to code configured by the user, that the configuration interface 101 is connected to an input dry contact, so as to control the switch circuit 105 in an open state. In this case, when the input dry contact is closed, the first end of the configuration interface 101 and the second end of the configuration interface 101 are connected, so that the direct current voltage source 104, the input dry contact, and the first resistor 106 form a loop. In this case, a particular voltage is generated between the two ends of the first resistor 106, so that the detection circuit 103 can detect that the voltage between the two ends of the first resistor 106 is greater than zero, and determine that the input dry contact is in a closed state. When the input dry contact does not perform an action, the first end of the configuration interface 101 disconnects from the second end of the configuration interface 101. In this case, a circuit formed by the direct current voltage source 104, the input dry contact, and the first resistor 106 does not form a loop, and there is no voltage between the two ends of the first resistor 106, so that the detection circuit 103 detects that the voltage between the two ends of the first resistor 106 is zero, and determines that the input dry contact is in an open state and does not perform an action. In this way, an objective of detecting the input dry contact is achieved.

Figure 2:
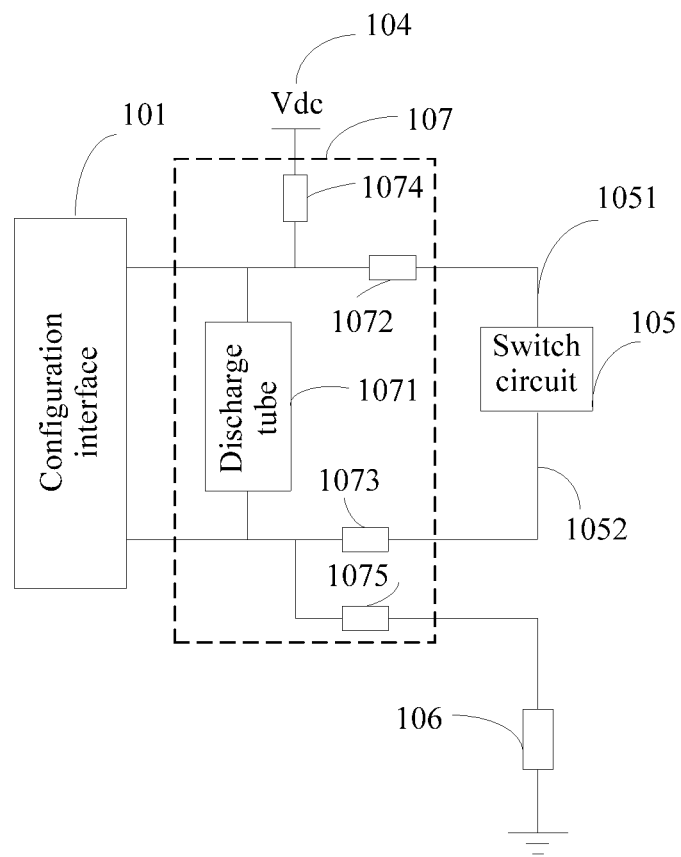
FIG. 2 is a schematic diagram of another monitoring circuit according to an embodiment of the present disclosure.

Further, as shown in FIG. 2, the monitoring circuit further includes a protection circuit 107.

The protection circuit 107 includes a discharge tube 1071, a second resistor 1072, a third resistor 1073, a fourth resistor 1074, and a fifth resistor 1075.

The first end of the configuration interface 101 is connected to the input end 1051 of the switch circuit 105 using the second resistor 1072, a first end of the second resistor 1072 is connected to the first end of the configuration interface 101, a second end of the second resistor 1072 is connected to the input end 1051 of the switch circuit 105, the second end of the configuration interface 101 is connected to the output end 1052 of the switch circuit 105 using the third resistor 1073, a first end of the third resistor 1073 is connected to the second end of the configuration interface 101, a second end of the third resistor 1073 is connected to the output end 1052 of the switch circuit 105, a first end of the discharge tube 1071 is connected to the first end of the second resistor 1072, a second end of the discharge tube 1071 is connected to the first end of the third resistor 1073, the first end of the configuration interface 101 is connected to the direct current voltage source 104 using the fourth resistor 1074, a first end of the fourth resistor 1074 is connected to the direct current voltage source 104, a second end of the fourth resistor 1074 is connected to the first end of the second resistor 1072, a first end of the fifth resistor 1075 is connected to the first end of the third resistor 1073, and a second end of the fifth resistor 1075 is connected to the first end of the first resistor 106.

The discharge tube 1071 includes a gas discharge tube.

It should be noted that the discharge tube 1071 may also be another discharge tube, for example, a semi-conductor discharge tube, which is not limited in the present application.

The protection circuit 107 is configured to bleed off an overcurrent generated by an overvoltage received by the configuration interface 101.

When the configuration interface 101 receives the overvoltage, the overvoltage can conduct the discharge tube 1071 in the protection 107, so that the discharge tube 1071 bleeds off the overcurrent generated by the overvoltage, and clamps a voltage to a voltage value. However, the voltage value further produces impact on a subsequent circuit; therefore, the second resistor 1072, the third resistor 1073, the fourth resistor 1074, and the fifth resistor 1075 are used in the present application to perform voltage division on the overvoltage, so as to reduce impact on the subsequent circuit exerted by a voltage obtained after the second resistor 1072, the third resistor 1073, the fourth resistor 1074, and the fifth resistor 1075 perform voltage division, which provides further protection for the subsequent circuit.

It should be noted that the first resistor 106, the second resistor 1072, and the third resistor 1073 may all be a high-resistance resistor, or multiple resistors may be connected in series to form one high-resistance resistor. The fourth resistor 1074 and the fifth resistor 1075 may both be a low-resistance resistor, or multiple resistors may be connected in parallel to form one low-resistance resistor.

Further, the switch circuit 105 includes a relay.

It should be noted that a moving contact of the relay is the input end 1051 of the switch circuit 105, a coil of the relay is the control end 1053 of the switch circuit 105, and a normally open contact of the relay is the output end 1052 of the switch circuit 105.

It should be noted that the switch circuit 105 may also be a circuit that is formed by another component and has a switch function, for example, the switch circuit is formed using a transistor or a field effect transistor, which is not limited in the present application.

Figure 3:
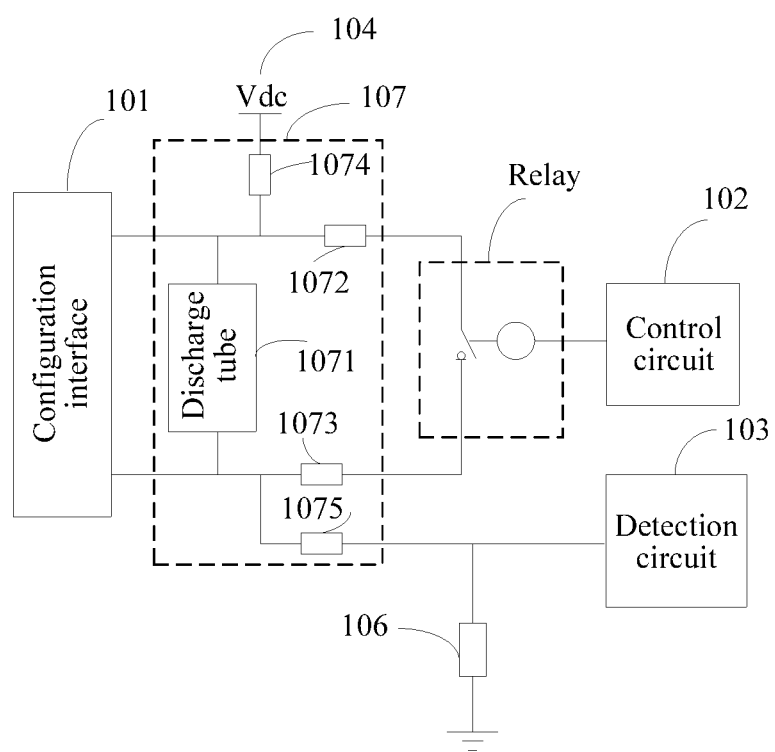
FIG. 3 is a schematic diagram of an instance of a monitoring circuit according to an embodiment of the present disclosure.

FIG. 3 is a schematic diagram of an instance of a monitoring circuit according to an embodiment of the present application. The monitoring circuit includes a configuration interface 101, a control circuit 102, a detection circuit 103, a direct current voltage source 104, a relay, a first resistor 106, and a protection circuit 107.

It should be noted that, for a specific connection manner, reference may be made to the connection manner in the foregoing embodiment, and details are not described herein again.

A specific working principle is as follows. When the configuration interface 101 is connected to an input dry contact, the control circuit 102 does not provide a current to a coil of the relay, so that the coil of the relay cannot generate induced electromotive force, that is, a moving contact of the relay cannot perform an action; therefore, the relay has no function. When the input dry contact is closed, a first end of the configuration interface 101 and a second end of the configuration interface 101 are connected, so that the direct current voltage source 104, the input dry contact, a fifth resistor 1075, and the first resistor 106 form a loop. In this case, a particular voltage is generated between two ends of the first resistor 106, so that the detection circuit 103 can detect that the voltage between the two ends of the first resistor 106 is greater than zero, and determine that the input dry contact is in a closed state. When the input dry contact does not perform an action, the first end of the configuration interface 101 disconnects from the second end of the configuration interface 101. In this case, a circuit formed by the direct current voltage source 104, the input dry contact, the fifth resistor 1075, and the first resistor 106 does not have a loop, and there is no voltage between the two ends of the first resistor 106, so that the detection circuit 103 detects that the voltage between the two ends of the first resistor 106 is zero, and determines that the input dry contact is in an open state and does not perform an action. In this way, an objective of detecting the input dry contact is achieved.

When the configuration interface 101 is connected to an output dry contact, and an action of the output dry contact is required, the control circuit 102 provides a current to the coil of the relay, so that the coil of the relay generates induced electromotive force; the moving contact and a normally open contact that are of the relay are closed, so that the direct current voltage source 104, a fourth resistor 1074, a second resistor 1072, the relay, a third resistor 1073, the fifth resistor 1075, and the first resistor 106 form a loop, so as to make the output dry contact work. In this case, the detection circuit 103 may determine a working status of the output dry contact by detecting a voltage between the two ends of the first resistor 106. When an action of the output dry contact is not required, the control circuit 102 does not provide a current to the coil of the relay, so that the coil of the relay cannot generate induced electromotive force, that is, the moving contact of the relay cannot perform an action, and the moving contact and the normally open contact that are of the relay are disconnected, so that the output dry contact cannot perform an action. In addition, because the moving contact and the normally open contact that are of the relay are disconnected, the direct current voltage source 104, the fourth resistor 1074, the second resistor 1072, the relay, the third resistor 1073, the fifth resistor 1075, and the first resistor 106 cannot form a loop. In this case, the detection circuit 103 detects that the voltage between the two ends of the first resistor 106 is zero, and therefore may determine that the output dry contact does not perform an action.

It should be noted that the first end and the second end that are of the configuration interface 101 are not distinguished by positive or negative polarity, and therefore the monitoring circuit in the embodiments of the present application may adopt the following connection.

The first end of the configuration interface 101 is separately connected to a first end of the first resistor 106 and an input end 1051 of the switch circuit 105, the second end of the configuration interface 101 is separately connected to the direct current voltage source 104 and an output end 1052 of the switch circuit 105, a control end 1053 of the switch circuit 105 is connected to the control circuit 102, a second end of the first resistor 106 is grounded, and the detection circuit 103 is connected to the first end of the first resistor 106.

It should be noted that a connection manner of the protection circuit 107 is similar to the connection manner in the foregoing embodiment, and details are not described herein again.

This embodiment of the present application provides a monitoring circuit, which includes a configuration interface, a control circuit, a detection circuit, a direct current voltage source, a switch circuit, and a first resistor. The configuration interface is configured to connect to a dry contact, the control circuit is configured to control closing or opening of the switch circuit, and the detection circuit is configured to detect a voltage between two ends of the first resistor. That is, when the configuration interface is connected to an input dry contact, the control circuit controls the switch circuit to be opened, and the detection circuit determines an action status of the input dry contact according to the detected voltage between the two ends of the first resistor; when the configuration interface is connected to an output dry contact, the control circuit controls closing or opening of the switch circuit according to a preset rule, and the detection circuit determines an action status of the output dry contact according to a value of the detected voltage between the two ends of the first resistor. In this way, an objective of detecting a dry contact is achieved. Therefore, when an output dry contact configured in a system cannot satisfy a user's use requirement, an input dry contact may be configured as an output dry contact; when an input dry contact configured in the system cannot satisfy a user's use requirement, an output dry contact may be configured as an input dry contact. Therefore, configurability of the system is improved.

An embodiment of the present application provides an electronic device, where the electronic device includes the monitoring circuit described in the foregoing embodiments.

This embodiment of the present application provides an electronic device, which includes a monitoring circuit, and the monitoring circuit includes a configuration interface, a control circuit, a detection circuit, a direct current voltage source, a switch circuit, and a first resistor. The configuration interface is configured to connect to a dry contact, the control circuit is configured to control closing or opening of the switch circuit, and the detection circuit is configured to detect a voltage between two ends of the first resistor. That is, when the configuration interface is connected to an input dry contact, the control circuit controls the switch circuit to be opened, and the detection circuit determines an action status of the input dry contact according to a value of the detected voltage between the two ends of the first resistor; when the configuration interface is connected to an output dry contact, the control circuit controls closing or opening of the switch circuit according to a preset rule, and the detection circuit determines an action status of the output dry contact according to a value of the detected voltage between the two ends of the first resistor. In this way, an objective of detecting a dry contact is achieved. Therefore, when an output dry contact configured in a system cannot satisfy a user's use requirement, an input dry contact may be configured as an output dry contact; when an input dry contact configured in the system cannot satisfy a user's use requirement, an output dry contact may be configured as an input dry contact. Therefore, configurability of the system is improved. In addition, compared with the prior art in which each of an input dry contact monitoring circuit and an output dry contact monitoring circuit uses one protection circuit the present application uses only one protection circuit, which reduces a circuit cost.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of hardware in addition to a software functional unit.

When the foregoing integrated unit is implemented in a form of a software functional unit, the integrated unit may be stored in a computer-readable storage medium. The software functional unit is stored in a storage medium and includes several instructions for instructing a computer device (which may be a personal computer, a server, or a network device) to perform some of the steps of the methods described in the embodiments of the present application. The foregoing storage medium includes any medium that can store program code, such as a universal serial bus (USB) flash drive, a removable hard disk, a read-only memory (ROM), a random access memory (RAM), a magnetic disk, or an optical disc.

Finally, it should be noted that the foregoing embodiments are merely intended for describing the technical solutions of the present application but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present application.

What is claimed is:

1. A monitoring circuit, comprising:
   a configuration interface;
   a control circuit;
   a detection circuit;
   a direct current voltage source;
   a switch circuit; and
   a first resistor,
   wherein a first end of the configuration interface is separately connected to the direct current voltage source and an input end of the switch circuit, wherein a second end of the configuration interface is separately connected to a first end of the first resistor and an output end of the switch circuit, wherein a control end of the switch circuit is connected to the control circuit, wherein a second end of the first resistor is grounded, and wherein the detection circuit is connected to the first end of the first resistor, wherein the configuration interface is configured to connect to a dry contact, wherein the dry contact comprises an input dry contact or an output dry contact, wherein the control circuit is configured to control closing or opening of the switch circuit, and wherein the detection circuit is configured to detect a voltage between two ends of the first resistor.

2. The circuit according to claim 1, wherein the control circuit is configured to control closing or opening of the switch circuit according to a preset rule when the configuration interface is connected to the output dry contact, and wherein the detection circuit is further configured to determine a working status of the output dry contact according to the detected voltage between the two ends of the first resistor.

3. The circuit according to claim 1, wherein the control circuit is configured to control the switch circuit to be opened when the configuration interface is connected to an input dry contact, and wherein the detection circuit is further configured to determine a working status of the input dry contact according to the detected voltage between the two ends of the first resistor.

4. The circuit according to claim 1, further comprising a protection circuit configured to bleed off an overcurrent generated by an overvoltage received by the configuration interface, wherein the protection circuit comprises:
   a discharge tube;
   a second resistor;
   a third resistor;
   a fourth resistor; and
   a fifth resistor,
   wherein the first end of the configuration interface is connected to the input end of the switch circuit using the second resistor, wherein a first end of the second resistor is connected to the first end of the configuration interface, wherein a second end of the second resistor is connected to the input end of the switch circuit, wherein the second end of the configuration interface is connected to the output end of the switch circuit using the third resistor, wherein a first end of the third resistor is connected to the second end of the configuration interface, wherein a second end of the third resistor is connected to the output end of the switch circuit, wherein a first end of the discharge tube is connected to the first end of the second resistor, wherein a second end of the discharge tube is connected to the first end of the third resistor, wherein the first end of the configuration interface is connected to the direct current voltage source using the fourth resistor, wherein a first end of the fourth resistor is connected to the direct current voltage source, wherein a second end of the fourth resistor is connected to the first end of the second resistor, wherein a first end of the fifth resistor is connected to the first end of the third resistor, and wherein a second end of the fifth resistor is connected to the first end of the first resistor.

5. The circuit according to claim 4, wherein the discharge tube comprises a gas discharge tube.

6. The circuit according to claim 1, wherein the switch circuit comprises a relay.

7. The circuit according to claim 1, wherein the detection circuit comprises:
an analog-to-digital conversion circuit; and
a microprocessing unit.

8. The circuit according to claim 1, wherein the control circuit comprises a switch circuit driving unit.

9. An electronic device comprising a monitoring circuit, wherein the monitoring circuit, comprises:
a configuration interface configured to connect to a dry contact comprising an input dry contact or an output dry contact;
a switch circuit;
a control circuit configured to control closing or opening of the switch circuit;
a first resistor;
a detection circuit configured to detect a voltage between two ends of the first resistor;
a direct current voltage source; and
wherein a first end of the configuration interface is separately connected to the direct current voltage source and an input end of the switch circuit, wherein a second end of the configuration interface is separately connected to a first end of the first resistor and an output end of the switch circuit, wherein a control end of the switch circuit is connected to the control circuit, wherein a second end of the first resistor is grounded, and wherein the detection circuit is connected to the first end of the first resistor.

10. The electronic device according to claim 9, wherein the control circuit is configured to control closing or opening of the switch circuit according to a preset rule when the configuration interface is connected to the output dry contact, and wherein the detection circuit is further configured to determine a working status of the output dry contact according to the detected voltage between the two ends of the first resistor.

11. The electronic device according to claim 10, wherein the control circuit is configured to control the switch circuit to be opened when the configuration interface is connected to an input dry contact, and wherein the detection circuit is further configured to determine a working status of the input dry contact according to the detected voltage between the two ends of the first resistor.

12. The electronic device according to claim 9, wherein the circuit further comprises a protection circuit configured to bleed off an overcurrent generated by an overvoltage received by the configuration interface, and wherein the protection circuit comprises:
a discharge tube;
a second resistor;
a third resistor;
a fourth resistor; and
a fifth resistor,
wherein the first end of the configuration interface is connected to the input end of the switch circuit using the second resistor, wherein a first end of the second resistor is connected to the first end of the configuration interface, wherein a second end of the second resistor is connected to the input end of the switch circuit, wherein the second end of the configuration interface is connected to the output end of the switch circuit using the third resistor, wherein a first end of the third resistor is connected to the second end of the configuration interface, wherein a second end of the third resistor is connected to the output end of the switch circuit, wherein a first end of the discharge tube is connected to the first end of the second resistor, wherein a second end of the discharge tube is connected to the first end of the third resistor, wherein the first end of the configuration interface is connected to the direct current voltage source using the fourth resistor, wherein a first end of the fourth resistor is connected to the direct current voltage source, wherein a second end of the fourth resistor is connected to the first end of the second resistor, wherein a first end of the fifth resistor is connected to the first end of the third resistor, and wherein a second end of the fifth resistor is connected to the first end of the first resistor.

13. The electronic device according to claim 12, wherein the discharge tube comprises a gas discharge tube.

14. The electronic device according to claim 10, wherein the switch circuit comprises a relay.

15. The electronic device according to claim 11, wherein the detection circuit comprises:
an analog-to-digital conversion circuit; and
a microprocessing unit.

16. The electronic device according to claim 15, wherein the control circuit comprises a switch circuit driving unit.

* * * * *